US008580625B2

(12) United States Patent
Lu et al.

(10) Patent No.: US 8,580,625 B2
(45) Date of Patent: Nov. 12, 2013

(54) METAL OXIDE SEMICONDUCTOR TRANSISTOR AND METHOD OF MANUFACTURING THE SAME

(76) Inventors: Tsuo-Wen Lu, Kaohsiung (TW); Tzung-Ying Lee, Pingtung County (TW); Jei-Ming Chen, Tainan (TW); Chun-Wei Hsu, Taipei (TW); Yu-Min Lin, Tainan (TW); Chia-Lung Chang, Tainan (TW); Chin-Cheng Chien, Tainan (TW); Shu-Yen Chan, Changhua County (TW)

(*) Notice: Subject to any disclaimer, the term of this patent is extended or adjusted under 35 U.S.C. 154(b) by 244 days.

(21) Appl. No.: 13/188,536

(22) Filed: Jul. 22, 2011

(65) Prior Publication Data
US 2013/0020657 A1 Jan. 24, 2013

(51) Int. Cl.
*H01L 21/00* (2006.01)
*H01L 21/84* (2006.01)

(52) U.S. Cl.
USPC ........... 438/157; 438/151; 438/176; 438/183; 438/218; 438/257; 438/279; 438/283; 438/294; 438/585; 438/591; 438/595; 438/692; 257/288; 257/368; 257/369; 257/374; 257/410; 257/E21.635; 257/E21.19

(58) Field of Classification Search
USPC ........... 257/288, 368, 369, 374, 410, E21.19, 257/E21.635, E29.128; 438/151, 157, 176, 438/183, 195–197, 218, 257, 278, 279, 283, 438/294, 585, 591, 595, 692
See application file for complete search history.

(56) References Cited

U.S. PATENT DOCUMENTS

| | | |
|---|---|---|
| 5,892,282 A | 4/1999 | Hong et al. |
| 6,096,659 A | 8/2000 | Gardner et al. |
| 6,177,303 B1 | 1/2001 | Schmitz et al. |
| 6,303,418 B1 | 10/2001 | Cha et al. |
| 6,458,684 B1 | 10/2002 | Guo et al. |
| 6,573,134 B2 | 6/2003 | Ma et al. |
| 6,960,416 B2 | 11/2005 | Mui et al. |
| 7,126,199 B2 | 10/2006 | Doczy et al. |
| 7,144,783 B2 | 12/2006 | Datta et al. |
| 7,148,548 B2 | 12/2006 | Doczy et al. |
| 7,153,784 B2 | 12/2006 | Brask et al. |
| 7,176,090 B2 | 2/2007 | Brask et al. |
| 7,186,605 B2 | 3/2007 | Cheng et al. |
| 7,208,361 B2 | 4/2007 | Shah et al. |
| 7,217,611 B2 | 5/2007 | Kavalieros et al. |
| 7,355,281 B2 | 4/2008 | Brask et al. |
| 7,407,876 B2 | 8/2008 | Ishizaka |
| 7,556,998 B2 | 7/2009 | Park et al. |
| 2006/0024953 A1 | 2/2006 | Papa Rao et al. |
| 2007/0145591 A1 | 6/2007 | Yano et al. |
| 2007/0259519 A1 | 11/2007 | Yang et al. |
| 2007/0262451 A1 | 11/2007 | Rachmady et al. |
| 2007/0272123 A1 | 11/2007 | Kennedy et al. |
| 2008/0076216 A1 | 3/2008 | Pae et al. |

(Continued)

*Primary Examiner* — Meiya Li

(57) ABSTRACT

A method for manufacturing a MOS transistor is provided. A substrate has a high-k dielectric layer and a barrier in each of a first opening and a second opening formed by removing a dummy gate and located in a first transistor region and a second transistor region. A dielectric barrier layer is formed on the substrate and filled into the first opening and the second opening to cover the barrier layers. A portion of the dielectric barrier in the first transistor region is removed. A first work function metal layer is formed. The first work function metal layer and a portion of the dielectric barrier layer in the second transistor region are removed. A second work function metal layer is formed. The method can avoid a loss of the high-k dielectric layer to maintain the reliability of a gate structure, thereby improving the performance of the MOS transistor.

26 Claims, 8 Drawing Sheets

(56) References Cited

U.S. PATENT DOCUMENTS

| | | |
|---|---|---|
| 2008/0224235 A1 | 9/2008 | Lavoie et al. |
| 2009/0057769 A1 | 3/2009 | Wei et al. |
| 2009/0186458 A1 | 7/2009 | Yu et al. |
| 2010/0044783 A1 | 2/2010 | Chuang et al. |
| 2010/0065926 A1 | 3/2010 | Yeh et al. |
| 2010/0068877 A1 | 3/2010 | Yeh et al. |
| 2010/0087055 A1 | 4/2010 | Lai et al. |
| 2010/0124818 A1 | 5/2010 | Lee et al. |
| 2010/0244141 A1 | 9/2010 | Beyer et al. |
| 2011/0031558 A1 | 2/2011 | Yu et al. |

METAL OXIDE SEMICONDUCTOR TRANSISTOR AND METHOD OF MANUFACTURING THE SAME

FIELD OF THE INVENTION

The present invention relates to a metal oxide semiconductor (MOS) transistor, and particularly to a MOS transistor including a gate structure with a high-k dielectric layer and a method for manufacturing the same.

BACKGROUND OF THE INVENTION

In a fabrication of an integrated circuit, for example, a MOS transistor, a gate structure including a high-k dielectric layer and a metal gate (hereafter called HK/MG for short) has been widely used so as to improve the performance of the integrated circuit.

Generally, in the technology for manufacturing the HK/MG, after a poly-silicon dummy gate is removed, the metal gate of the HK/MG is formed. The high-k dielectric layer can be formed before removing the poly-silicon dummy gate (High-K first) or after removing the poly-silicon dummy gate (High-K last). However, in the typical method for manufacturing the metal gate, the high-k dielectric layer is prone to be etched by the etchants used during forming the metal gate so as to generate a loss of the high-k dielectric layer, thereby affecting the reliability of the gate structure of a n-type MOS transistor and the performance of the MOS transistor.

SUMMARY OF THE INVENTION

The present invention provides a method for manufacturing a MOS transistor so as to avoid a loss of a high-k dielectric layer, thereby maintaining the reliability of a gate structure and improving the performance of the MOS transistor.

The present invention also provides a MOS transistor, which has a gate structure with a simple layer structure. The reliability of the gate structure is high and the performance of the MOS transistor is good.

The present invention provides a method for manufacturing a MOS transistor. A substrate comprising a first transistor region and a second transistor region is provided. The substrate has a first opening and a second opening, formed by removing a dummy gate, in the first transistor region and the second transistor region respectively. The substrate includes a high-k dielectric layer formed thereon and a barrier formed on the high-k dielectric layer in each of the first opening and the second opening. A dielectric barrier layer is formed on the substrate and filled into the first opening and the second opening to cover the barrier layers. A portion of the dielectric barrier layer in the first transistor region is removed so as to expose the barrier layer in the first opening. A first work function metal layer is formed on the substrate after removing the portion of the dielectric barrier layer in the first transistor region and filled into the first opening and the second opening. The first work function metal layer in the second transistor region is removed. A portion of the dielectric barrier layer in the second transistor region is removed so as to expose the barrier layer in the second opening. A second work function metal layer is formed on the substrate after removing the portion of the dielectric barrier layer in the second transistor region and filled into the first opening and the second opening.

In one embodiment of the present invention, the dielectric barrier layer is a silicon nitride layer.

In one embodiment of the present invention, a thickness of the silicon nitride layer is in a range from 20 to 40 angstroms.

In one embodiment of the present invention, the silicon nitride layer is formed by an atomic layer deposition process.

In one embodiment of the present invention, the portion of the dielectric barrier layer in the first transistor region and the portion of the dielectric barrier layer in the second transistor region each are removed by a dry etching process.

In one embodiment of the present invention, the first work function metal layer in the second transistor region is removed by a wet etching process.

In one embodiment of the present invention, the barrier layer is a titanium nitride layer.

In one embodiment of the present invention, the first work function metal layer comprises titanium nitride, and the second work function metal layer comprises titanium aluminum.

In one embodiment of the present invention, the step of forming the substrate includes the following steps. An isolation structure is formed in a silicon substrate so as to define the first transistor region and the second transistor region. A first dummy gate structure and a second dummy gate structure are formed on the silicon substrate and located in the first transistor region and the second transistor region respectively. The first dummy gate structure and the second dummy gate structure each includes the high-k dielectric layer, the barrier layer and the dummy gate on the barrier layer. Two spacers are formed. The two spacers surround the first dummy gate structure and the second dummy gate structure respectively. A dielectric layer is formed on the silicon substrate to cover the first dummy gate structure, the second dummy gate structure and the two spacers. A planarization process is applied to the dielectric layer so as to expose the dummy gates. The dummy gates are removed to form the first opening in the first transistor region and the second opening in the second transistor region.

In one embodiment of the present invention, the step of removing the portion of the dielectric barrier layer in the first transistor region includes the following steps. A first patterned photoresist layer is formed on the dielectric barrier layer so that the second transistor region is covered by the first patterned photoresist layer and the first transistor region is exposed from the first patterned photoresist layer. The dielectric barrier layer on the dielectric layer in the first transistor region and the dielectric barrier layer on the barrier layer and at a bottom of the first opening are removed. The first patterned photoresist layer is removed.

In one embodiment of the present invention, before the step of removing the first work function metal layer in the second transistor region, the method further includes an etch back process to remove the first work function metal layer on the dielectric layer in the first transistor region.

In one embodiment of the present invention, the etch back process includes the following steps. A second patterned photoresist layer is formed on the first work function metal layer so that the second transistor region is covered by the second patterned photoresist layer and the first transistor region is exposed from the second patterned photoresist layer. The first work function metal layer on the dielectric layer in the first transistor region is removed. The second patterned photoresist layer is removed.

In one embodiment of the present invention, the first work function metal layer in the second transistor region is removed by a wet etching process.

In one embodiment of the present invention, the step of removing the first work function metal layer in the second transistor region includes the following steps. A third patterned photoresist layer is formed on the first work function metal layer so that the first transistor region is covered by the third patterned photoresist layer and the second transistor region is exposed from the third patterned photoresist layer. The first work function metal layer on the dielectric barrier layer in the second transistor region is removed. The third patterned photoresist layer is removed after the step of removing the portion of the dielectric barrier layer in the second transistor region.

In one embodiment of the present invention, after forming the second work function metal layer, the method further includes forming a contact metal layer covering the second work function metal layer.

In one embodiment of the present invention, forming the contact metal layer includes forming a low resistance conductive material layer to cover the second work function metal layer, and performing a chemical mechanical polishing process to remove the low resistance conductive material layer outside the first opening and the second opening and the second work function metal layer outside the first opening and the second opening.

The present invention also provides a MOS transistor including a silicon substrate, a gate structure disposed on the silicon substrate. The gate structure includes a high-k dielectric layer disposed on the silicon substrate, a barrier layer disposed on the high-k dielectric layer, and a work function layer disposed on and contacted with the barrier layer. The MOS transistor further includes a dielectric material spacer. The dielectric material spacer is disposed on the barrier layer of the gate structure and surrounding the work function layer of the gate structure.

In one embodiment of the present invention, the gate structure further includes an interface layer disposed between the high-k dielectric layer and the silicon substrate.

In one embodiment of the present invention, the work function layer includes a titanium nitride layer and a titanium aluminum layer on the titanium nitride layer.

In one embodiment of the present invention, the work function layer includes a titanium aluminum layer.

In one embodiment of the present invention, the barrier layer is a titanium nitride layer.

The present invention still provides a method for manufacturing a MOS transistor. A substrate having an opening is provided. A high-k dielectric layer and a barrier formed on the high-k dielectric layer are disposed on the substrate and are located at the bottom of the opening. A dielectric barrier layer is formed on the substrate and filled into the opening to cover a sidewall of the opening and the barrier layer located at the bottom of the opening. The dielectric barrier layer on the barrier layer located at the bottom of the opening is removed so as to expose the barrier layer in the opening. A work function metal layer is formed on the substrate and filled into the opening. The work function metal layer covers the dielectric barrier layer on the sidewall of the opening and covers the barrier layer located at the bottom of the opening.

In one embodiment of the present invention, dielectric barrier layer on the barrier layer located at the bottom of the opening is removed by a dry etching process.

In one embodiment of the present invention, the work function layer includes a titanium aluminum layer.

In one embodiment of the present invention, the work function layer includes a titanium nitride layer and a titanium aluminum layer on the titanium nitride layer.

In the method for manufacturing the MOS transistor of the present invention, the dielectric barrier layer is formed on the barrier layer on the high-k dielectric layer. When the first work function metal layer in the second MOS region is removed by using a wet etching process, the dielectric barrier layer such as the silicon nitride layer can not be etched by an etchant of the wet etching process. Thus, the dielectric barrier layer is an effective etch stop layer during removing the first work function metal layer in the second MOS region. Meanwhile, a suitable process, for example, a dry etching process can etch the dielectric barrier layer such as the silicon nitride layer, but can barely etch the barrier layer such as the titanium nitride layer. Therefore, when the dielectric barrier layer is removed, the barrier layer and the high-k dielectric layer under the dielectric barrier layer can not be etched. Accordingly, the method for manufacturing the MOS transistor can avoid a loss of the high-k dielectric layer, thereby maintaining the reliability of a gate structure of an n-type MOS transistor and improving the performance of the MOS transistor. In addition, because the first work function metal layer or the second work function metal layer is directly formed on and contacted with the barrier layer (i.e., there is not a tantalum nitride layer located between the first work function metal layer or the second work function metal layer and the barrier layer), the structures of the gate structure can be simplified.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
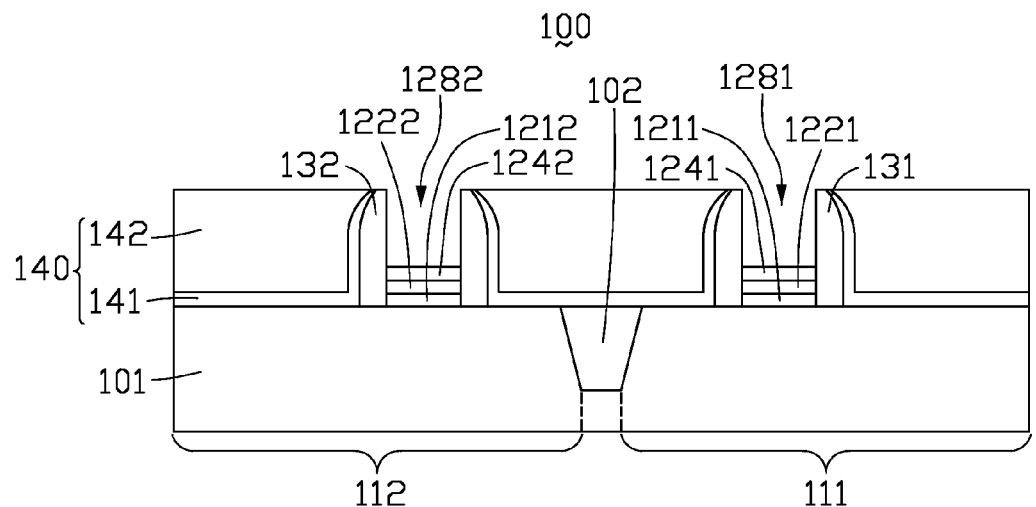
FIGS. 1A-1N illustrate a partial process flow of a method for manufacturing a MOS transistor in accordance with an embodiment of the present invention.
Figure 1B:
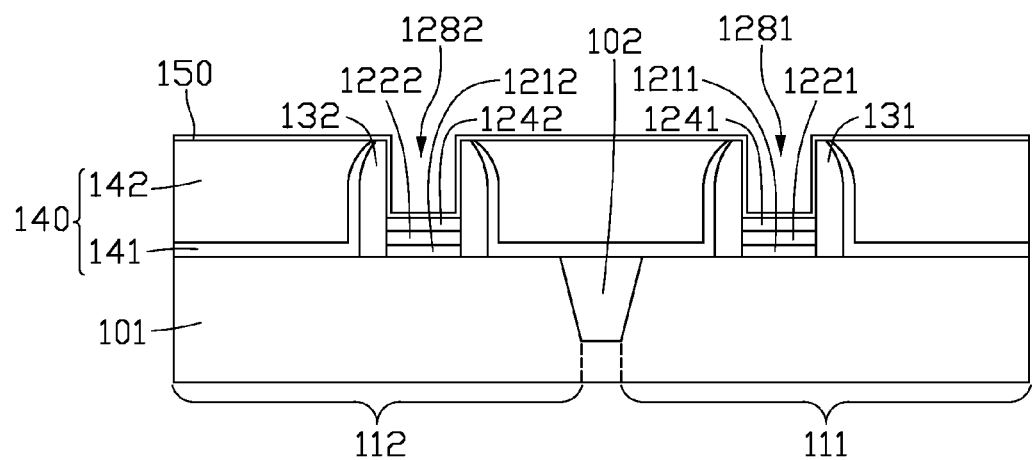
Figure 1C:
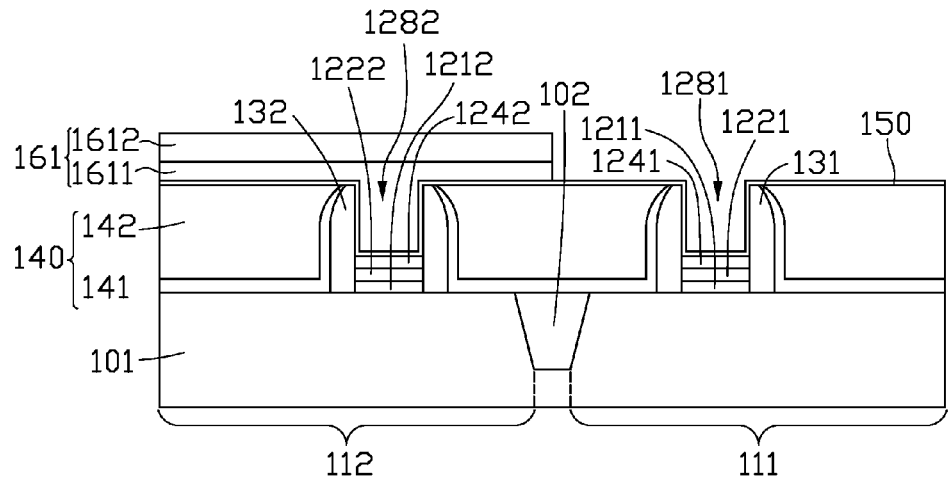
Figure 1D:
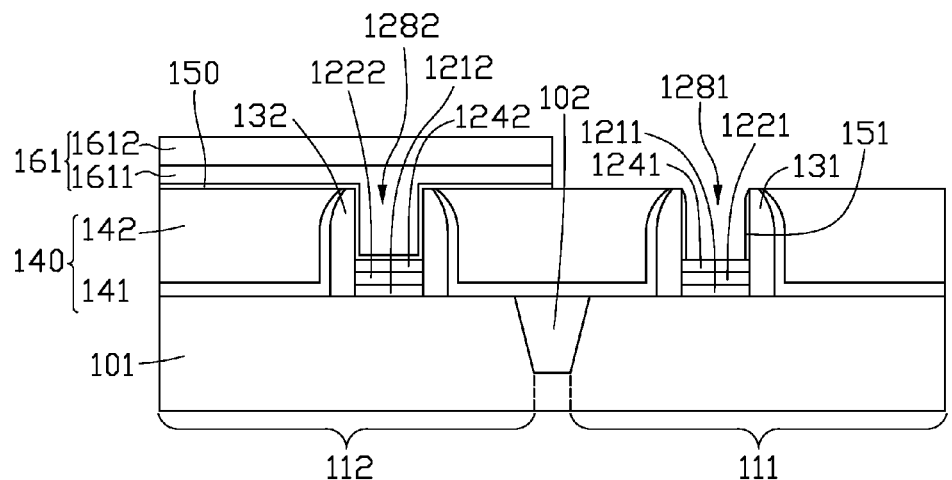
Figure 1E:
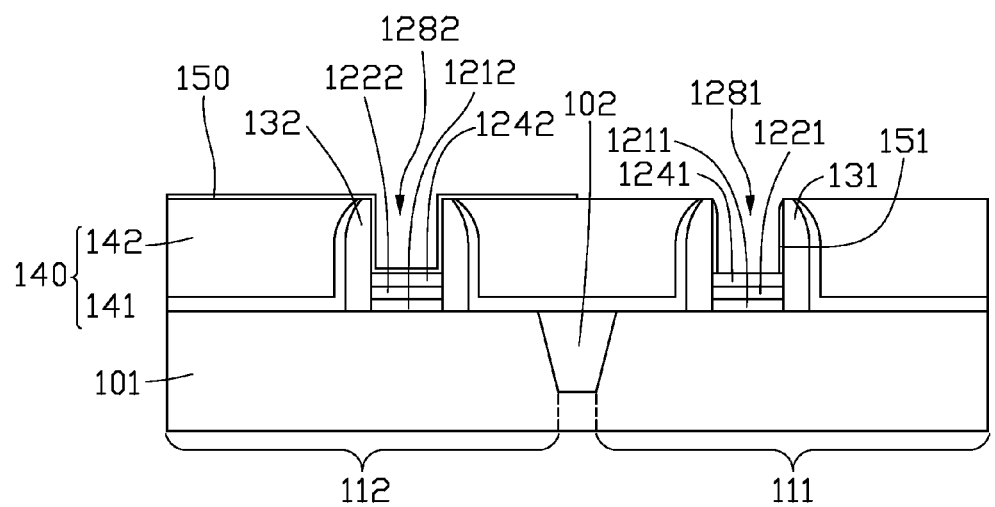
Figure 1F:
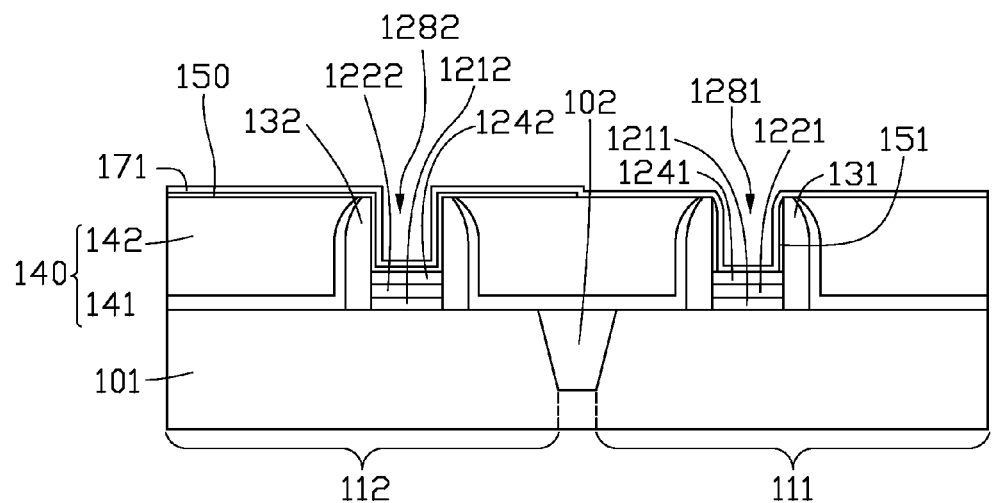
Figure 1G:
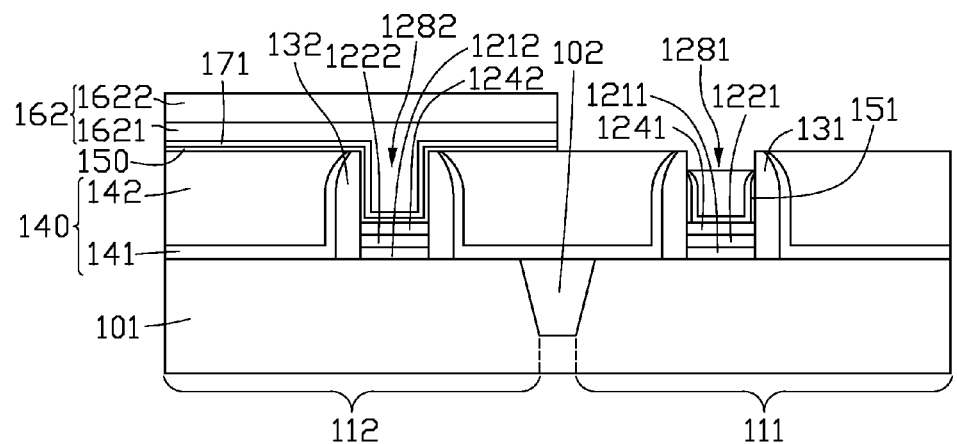
Figure 1H:
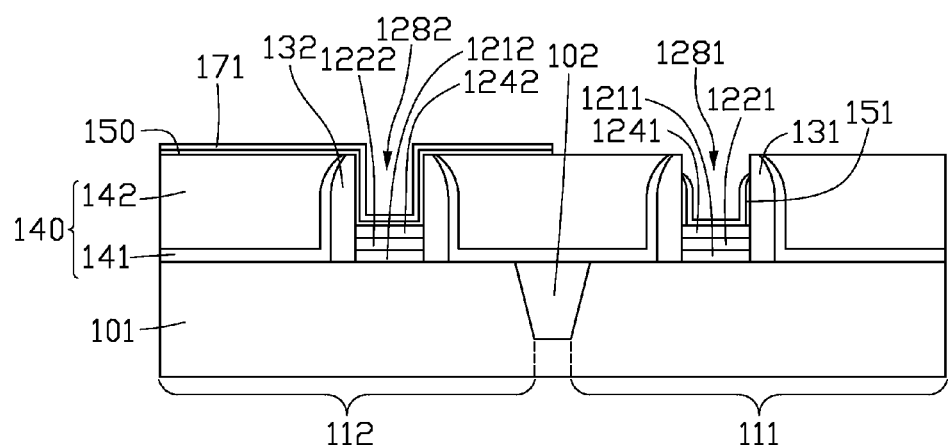
Figure 1I:
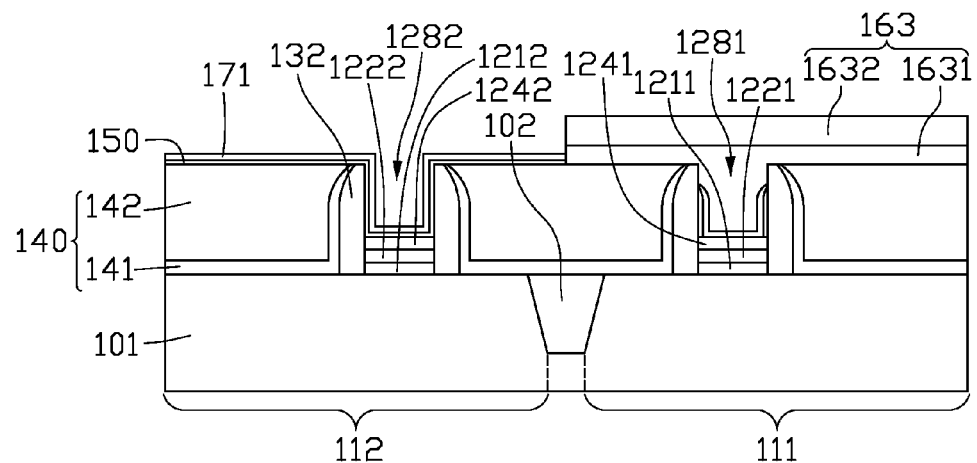
Figure 1J:
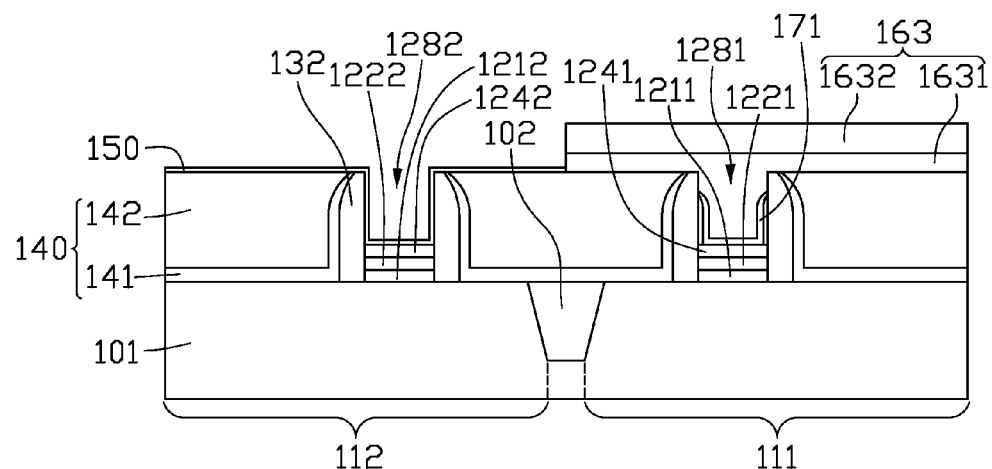
Figure 1K:
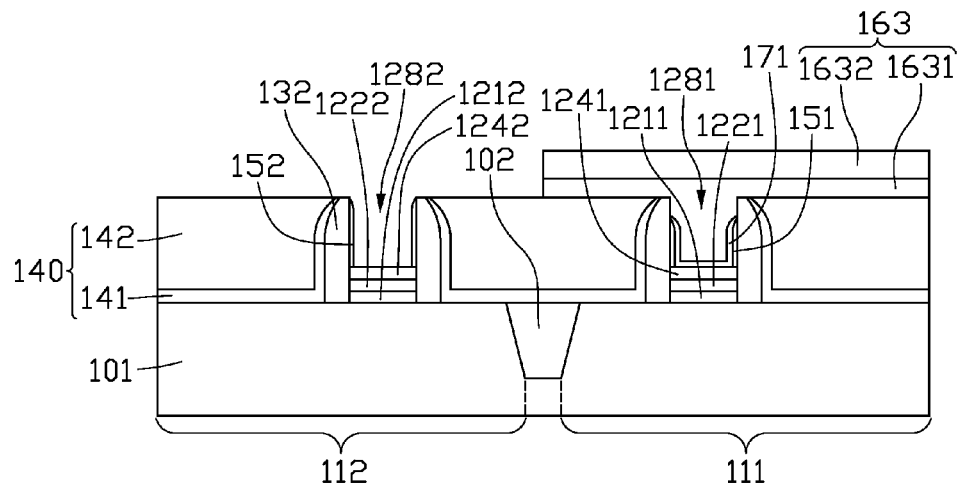
Figure 1L:
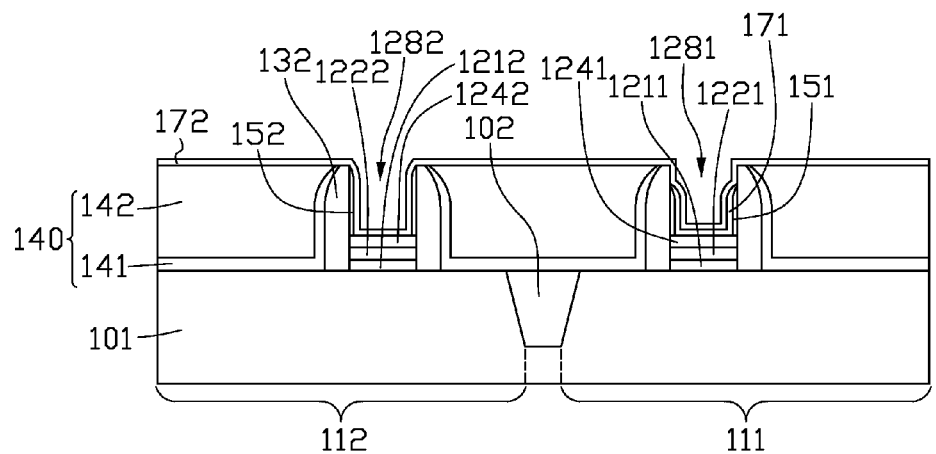
Figure 1M:
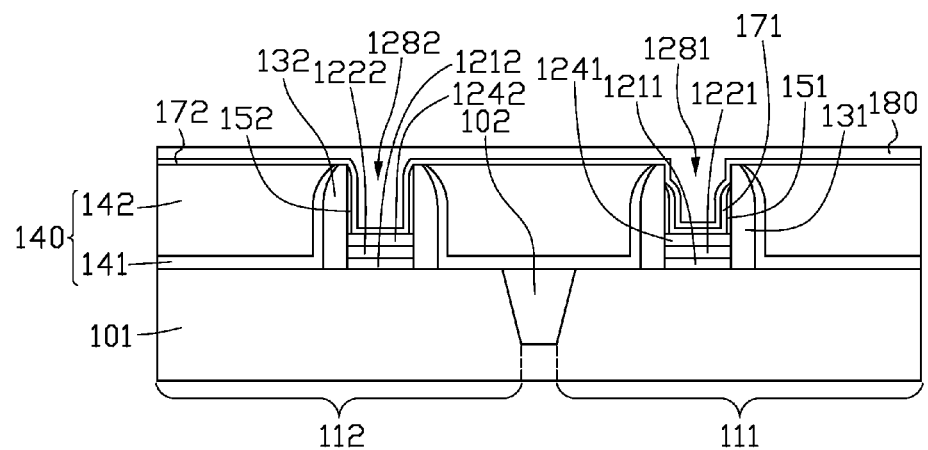
Figure 1N:
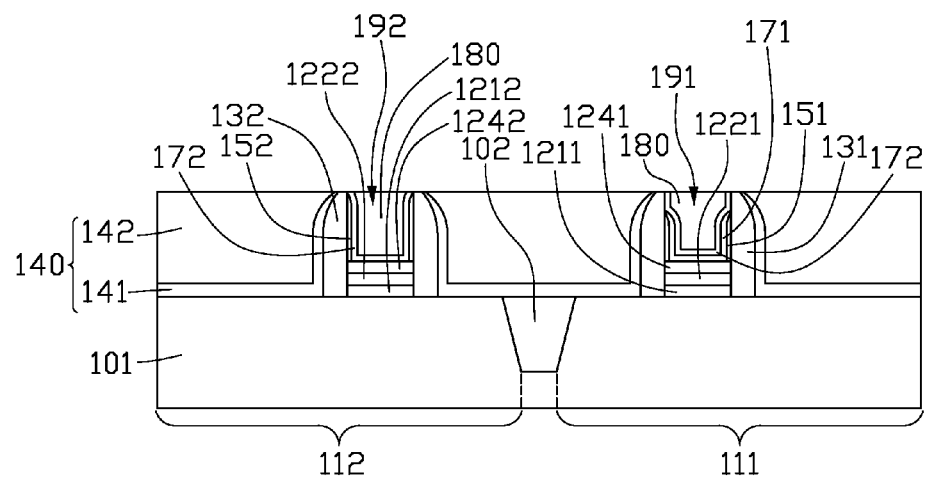

FIGS. 1A-1N illustrate a partial process flow of a method for manufacturing a MOS transistor in accordance with first embodiment of the present invention. In the present embodiment, a high-k first process (i.e., a high-k dielectric layer is firstly formed before removing a poly-silicon dummy gate) is, but not limited to, used as an example to describe the method for manufacturing a MOS transistor. In other words, a MOS transistor includes any gate structure having the high-k dielectric layer can utilize the method for manufacturing a MOS transistor.

Referring to FIG. 1A, a substrate 100 is formed by the following steps. At first, an isolation structure 102 is formed in a silicon substrate 101 so as to define a first transistor region 111 and a second transistor region 112. In the present embodiment, the silicon substrate 101 in the first transistor region 111 and in the second transistor region 112 are respectively configured for forming a p-type MOS transistor and a n-type MOS transistor thereon. Next, a first dummy gate structure (not labeled) and a second dummy gate structure (not labeled) are formed on the silicon substrate 101 and located in the first transistor region 111 and the second transistor region 112 respectively. In the present embodiment, the first dummy gate structure and the second dummy gate structure each includes an interface layer 1211/1212, a high-k dielectric layer 1221/1222 disposed on the interface layer 1211/1212, a barrier layer 1241/1242 disposed on the high-k dielectric layer 1221/1222, and a dummy gate (not shown) disposed on the barrier layer 1241/1242. In other embodiments, the interface layer 1211/1212 can be omitted in the first dummy gate structure and the second dummy gate structure. In the present embodiment, the barrier layer 1241/1242 is, for example, a titanium nitride layer, and the dummy gate is, for example, a poly-silicon dummy gate. Two spacers 131,132 are formed. The spacer 131 surrounds the first dummy gate structure and the spacer 132 surrounds the second dummy gate structure respectively. A dielectric layer 140 is formed on the silicon substrate 101 to cover the first dummy gate structure, the second dummy gate structure and the two spacers 131, 132. In the present embodiment, the dielectric layer 140 is, for example, a multilayer structure including a contact etch stop layer (CESL) 141 and an interlevel layer dielectric (ILD) 142 on the contact etch stop layer 141. The interlevel layer dielectric 142 can be a multilayer structure. Next, a planarization process is applied to the dielectric layer 140 so as to expose the dummy gates. The dummy gates are removed to form a first opening 1281 in the first transistor region 111 and a second opening 1282 in the second transistor region 102.

It is noted that, forming the substrate 100 further includes a step of forming a lightly doped drain, a step of forming a source/drain region, and so on. Such structures and steps are familiar to one ordinarily skilled in the art, and not shown and described here. Additionally, if a high-k last process (i.e., a high-k dielectric layer is firstly formed after removing a poly-silicon dummy gate) is used, it is not necessary to form the high-k dielectric layer before the poly-silicon dummy gate is removed. That is, the high-k dielectric layer is formed after the poly-silicon dummy gate is removed Referring to FIG. 1B, the dielectric barrier layer 150 is formed on the dielectric layer 140 and is conformally filled into the first opening 1281 and the second opening 1282 to cover a sidewall of the first opening 1281 and the second opening 1282 and the barrier layers 1241, 1242. The dielectric barrier layer 150 is formed by an atomic layer deposition process or other suitable process. In the present embodiment, the dielectric barrier layer 150 is, but not limited to, a silicon nitride layer. A thickness of the dielectric barrier layer 150 is in a range from 20 to 40 angstroms.

Referring to FIG. 1C and FIG. 1D, after the dielectric barrier layer 150 is formed, a portion of the dielectric barrier layer 150 in the first transistor region 111 is removed. In the present embodiment, the portion of the dielectric barrier layer 150 removed is removed by a dry etching process.

In detail, referring to FIG. 1C, a first patterned photoresist layer 161 is formed on the dielectric barrier layer 150 so that the second transistor region 112 is covered by the first patterned photoresist layer 161 and the first transistor region 111 is exposed from the first patterned photoresist layer 161. In the present embodiment, the first patterned photoresist layer 161 includes a bottom anti-reflective coating 1611 and a photoresist mask 1612. In detail, at first, the bottom anti-reflective coating 1611 is formed to cover the entire dielectric barrier layer 150 and is filled in the first opening 1281 and the second opening 1282. Then, the photoresist mask 1612 is disposed on the bottom anti-reflective coating 1611 so as to expose the bottom anti-reflective coating 1611 in the first transistor region 111. Thereafter, the bottom anti-reflective coating 1611 exposed from the photoresist mask 1612 is removed to form the first patterned photoresist layer 161.

Referring to FIG. 1D, the dielectric barrier layer 150 on the dielectric layer 140 in the first transistor region 111 exposed from the first patterned photoresist layer 161, the dielectric barrier layer 150 on a sidewall of the first opening 1281, and the dielectric barrier layer 150 on the barrier layer 1241 and at a bottom of the first opening exposed from the first patterned photoresist layer 161 are removed by using a dry etching process, for example, an anisotropic dry etching process. Thus, the barrier layer 1241 is exposed from the first opening. In the present embodiment, during the dry etching process, the dielectric barrier layer 150 in the first transistor region 111 is not etched entirely, and a portion of the dielectric barrier layer 150 remains on the sidewall of the first opening 1281. The portion of the dielectric barrier layer 150 remaining on the sidewall of the first opening 1281 becomes a dielectric material spacer 151 surrounding a metal gate formed in the subsequent steps. Referring to FIG. 1E, the first patterned photoresist layer 161 is removed.

Referring to FIG. 1F, after the portion of the dielectric barrier layer 150 in the first transistor region 111 is removed, a first work function metal layer 171 is conformally formed to cover the entire substrate. In the present embodiment, the first work function metal layer 171 is, for example, a titanium nitride layer, to cover the dielectric layer 140 in the first transistor region 111 and the dielectric barrier layer 150 in the second transistor region, and is filled in the first opening 1281 to cover the dielectric barrier layer 150 on the sidewall of the first opening 1281 and the barrier layer 1241 and is filled in the second opening 1282 to cover the dielectric barrier layer 150 in the second opening 1282.

In the present embodiment, an etch back process is optionally applied to the first work function metal layer 171. The first work function metal layer 171 on the dielectric layer 140 in the first transistor region 111 is etched back, thereby increasing a size of a top portion of the first opening. Thus, subsequent layers can be filled into the first opening readily. Referring to FIG. 1G, a second patterned photoresist layer 162 is formed on the first work function metal layer 171 so that the second transistor region 112 is covered by the second patterned photoresist layer 162 and the first transistor region 111 is exposed from the second patterned photoresist layer 162. In the present embodiment, the second patterned photoresist layer 162 includes a bottom anti-reflective coating 1621 and a photoresist mask 1622 on the bottom anti-reflective coating 1621. The formation of the second pattern photoresist layer 162 is similar to the formation of the first patterned photoresist layer 161 and is not described here. It is noted that, when removing the bottom anti-reflective coating 1621, a portion of the bottom anti-reflective coating 1621 is remained in the first opening 1281. Next, the first work function metal layer 171 on the dielectric layer 140 and at the top portion of the first opening is etched back. In the present embodiment, the first work function metal layer 171 on the dielectric layer 140 in the first transistor region 111 is removed by using, for example, a wet etching process. The portion of the bottom anti-reflective coating 1621 in the first opening 1281 is configured for protecting the first work function metal layer 171 on the barrier layer 1241 in the first opening 1281 from being etched. Next, referring to FIG. 1H, the second patterned photoresist layer 162 is removed.

It is noted that, when the etch back process is not performed, the first work function metal layer 171 on the dielectric layer 140 in the first transistor region 111 can be removed in a subsequent chemical mechanical polishing process of forming a contact conductive layer.

Referring to FIG. 1I to FIG. 1K, the first work function metal layer 171 on the dielectric barrier layer 150 in the second transistor region 112 is removed. In detail, referring to FIG. 1I, at first, a third patterned photoresist layer 163 is formed on the first work function metal layer 171 so that the first transistor region 111 is covered by the third patterned photoresist layer 163 and the second transistor region 112 is exposed from the third patterned photoresist layer 163. In the present embodiment, the third patterned photoresist layer 163 includes a bottom anti-reflective coating 1631 and a photoresist mask 1632 on the bottom anti-reflective coating 1631. The formation of the third patterned photoresist layer 163 is similar to the formation of the first pattern photoresist layer 161 and is not described here. Next, referring to FIG. 1J, the first work function metal layer 171 on the dielectric barrier layer 150 in the second transistor region 112 exposed from the third patterned photoresist layer 163 is removed by using, for example, a wet etching process. Due to the property of the materials of the dielectric barrier layer 150 and the first work function metal layer 171, a common etchant has a high selectivity to the dielectric barrier layer 150 and the first work function metal layer 171. That is, an etching action of the common etchant to the dielectric barrier layer 150 is smaller than an etching action of the common etchant to the first work function metal layer 171. Thus, the dielectric barrier layer 150 can not be etched by an etchant of the wet etching process, and the dielectric barrier layer 150 is an effective etch stop layer in the wet etching process and can protect the layers under the dielectric barrier layer 150.

Referring to 1K, the portion of the dielectric barrier layer 150 in the second transistor region 112 exposed from the third patterned photoresist layer 163 is removed by using the third patterned photoresist layer 163 as a mask. For example, the dielectric barrier layer 150 on the dielectric layer 140 in the second transistor region 112, the dielectric barrier layer 150 on a sidewall of the second opening 1282, and the dielectric barrier layer 150 on the barrier layer 1242 and at the bottom of the second opening 1282 are removed so as to expose the barrier layer 1242 in the second opening 1282. In the present embodiment, a dry etching process such as anisotropic dry etching process is, but not limited to, applied to remove the portion of the dielectric barrier layer 150 in the second transistor region 112. The dry etching process can remove the dielectric barrier layer 150, but can barely etch the barrier layer 1242 made of titanium nitride. Thus, during removing the dielectric barrier layer 150 in the second transistor region 112 by using the dry etching process, the barrier layer 1242 under the dielectric barrier layer 150 in the second transistor region 112 will not be etched. Thus, the high-k dielectric layer 1222 under the barrier layer 1242 will be protected effectively and avoid a loss of the high-k dielectric layer 1222, thereby maintaining the reliability of the gate structure. It is noted that, other suitable etching process which can etch the dielectric barrier layer 150 but can barely etch the barrier layer 1242 made of titanium nitride can be used. Similarly, during the dry etching process, the dielectric barrier layer 150 in the second transistor region 112 is not etched entirely, and a portion of the dielectric barrier layer 150 remains on the sidewall of the second opening 1282. The portion of the dielectric barrier layer 150 remaining on the sidewall of the second opening 1282 becomes a dielectric material spacer 152 surrounding a metal gate formed in the subsequent steps. Referring to FIG. 1E, the third patterned photoresist layer 163 is removed.

Next, referring to FIG. 1L, a second work function metal layer 172 is formed to cover the barrier layer 1242 in the second transistor region 112 and to cover the first work function metal layer 171 in the first transistor region 111. In the present embodiment, after the step of removing the portion of the dielectric barrier layer 150 on the barrier layer 1242 in the second transistor region 112, the second work function metal layer 172 is conformally formed on the dielectric layer 140, is filled in the first opening 1281 to cover the first work function metal layer 171, and is filled in the second opening 1282 to cover the dielectric material spacer 152 and the barrier layer 1242. In the present embodiment, the second work function metal layer 172 is, for example, a titanium aluminum layer.

It is noted that, the first work function metal layer 171 is configured for adjusting a work function of a transistor (e.g., a PMOS) in the first transistor region, and second work function metal layer 172 is configured for adjusting a work function of a transistor (e.g., a NMOS) in the second transistor region. Thus, the materials used to adjust a work function of the PMOS can be formed the first work function metal layer 171, and the materials used to adjust a work function of the NMOS can be formed the second work function metal layer 172.

Referring to FIG. 1M and FIG. 1N, after forming the second work function metal layer 172, a contact conductive layer can be formed so as to finish a MOS transistor. Firstly, as shown in FIG. 1M, a low resistance conductive material layer 180, for example, an aluminum layer, is formed on the second work function metal layer 172. Secondly, as shown in FIG. 1N, a chemical mechanical polishing process is performed to remove a portion of the low resistance conductive material layer 180 and the second work function metal layer 172 on the dielectric layer 140. That is, the low resistance conductive material layer 180 outside the first opening 1281 and the second opening 1282 and the second work function metal layer 172 outside the first opening 1281 and the second opening 1282 are removed. Thus, the transistor in the first transistor region 111 and the second transistor region 112 are completed.

Figure 2A:
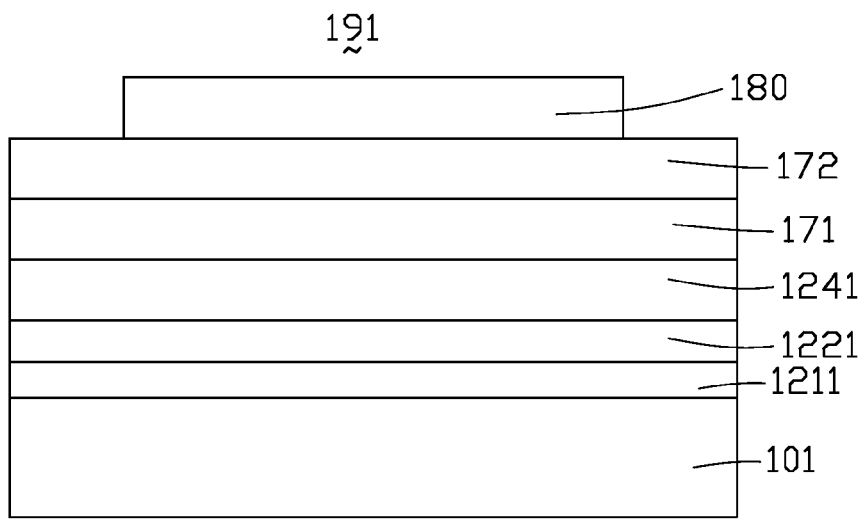
FIG. 2A illustrates a schematic, cross-sectional view of a first gate structure of a MOS transistor in accordance with an embodiment of the present invention.
Figure 2B:
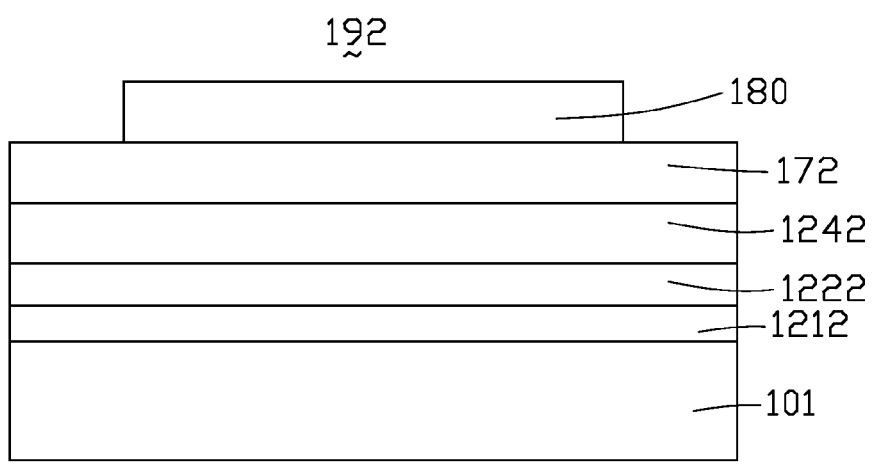
FIG. 2B illustrates a schematic, cross-sectional view of a second gate structure of a MOS transistor in accordance with an embodiment of the present invention.

After aforesaid steps, the MOS transistor 200 as shown in FIG. 1N is finished. The MOS transistor includes a silicon substrate 101 and a first gate structure 191 and a second gate structure 192 disposed on the silicon substrate 101. Referring to FIG. 2A and FIG. 2B, the first gate structure 191 includes the high-k dielectric layer 1221, the barrier layer 1241, the first work function metal layer 171 and the second work function metal layer 172. The second gate structure 192 includes the high-k dielectric layer 1222, the barrier layer 1242 and the second work function metal layer 172. The high-k dielectric layer 1221/1222 is disposed on the silicon substrate 101. Preferably, the interface layer 1211/1212 can be disposed between the high-k dielectric layer 1221/1222 and the silicon substrate 101. The barrier layer 1241/1242 is disposed on the high-k dielectric layer 1221/1222. The first work function metal layer 171 is disposed on and directly contacted with the barrier layer 1241. In the present embodiment, because the first work function metal layer 171 and the barrier layer 1241 both use titanium nitride as their material, the continuity of the material is beneficial for improving the performance of the p-type MOS transistor. The second work function metal layer 172 is disposed on and directly contacted with the barrier layer 1242. In other words, in the present embodiment, there is no tantalum nitride layer located between the first work function metal layer 171 and the barrier layer 1241 or between the second work function metal layer 172 and the barrier layer 1242. Thus, the structures of the first gate structure 191 and the second gate structure 192 is simplified.

Additionally, again referring to FIG. 1N, in the present embodiment, the dielectric barrier layer 150 is used as the etch stop layer when the step of removing the first work function metal layer 171 in the second transistor region 112. The dielectric barrier layer 150 becomes the thin dielectric material spacer 151 and the thin dielectric material spacer 152 after the dry etching process. The dielectric material spacer 151 surrounds the first work function metal layer 171 and the second work function metal layer 172 of the first gate structure 191, and disposed on the barrier layer 1241 of the first gate structure 191. The dielectric material spacer 151 surrounds the second work function metal layer 172 of the second gate structure 192 and disposed on the barrier layer 1242 of the second gate structure 192. In other words, the dielectric material spacers 151, 152 is disposed on the barrier layers 1241, 1242 and respectively surround the work function layers of the first gate structure 191 and the second gate structure 192.

In summary, in the method for manufacturing the MOS transistor of the present invention, the dielectric barrier layer is formed on the barrier layer on the high-k dielectric layer. When the first work function metal layer in the second transistor region is removed by using a wet etching process, the dielectric barrier layer such as the silicon nitride layer is not etched by an etchant of the wet etching process. Thus, the dielectric barrier layer is an effective etch stop layer during removing the first work function metal layer in the second MOS region. Meanwhile, a suitable process, for example, a dry etching process can etch the dielectric barrier layer such as the silicon nitride layer, but barely etch the barrier layer such as the titanium nitride layer. Therefore, when the dielectric barrier layer is removed, the barrier layer and the high-k dielectric layer under the dielectric barrier layer are not etched. Accordingly, the method for manufacturing the MOS transistor can avoid a loss of the high-k dielectric layer, thereby maintaining the reliability of a gate structure of an n-type MOS transistor and improving the performance of the MOS transistor. In addition, because the first work function metal layer or the second work function metal layer is directly formed on and contacted with the barrier layer (i.e., there is no tantalum nitride layer located between the first work function metal layer or the second work function metal layer and the barrier layer), the structures of the gate structure is simplified.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a MOS transistor, comprising:
   forming a substrate, the substrate defining a first transistor region and a second transistor region and having a first opening and a second opening formed by removing a dummy gate, the substrate comprising a high-k dielectric layer and a barrier layer on the high-k dielectric layer in each of the first opening and the second opening;
   forming a dielectric barrier layer on the substrate to fill into the first opening and the second opening and to cover the barrier layer;
   removing a first portion of the dielectric barrier layer in the first transistor region so as to expose the barrier layer in the first opening;
   forming a first work function metal layer on the substrate after removing the portion of the dielectric barrier layer in the first transistor region to fill into the first opening and the second opening;
   removing the first work function metal layer in the second transistor region;
   removing a second portion of the dielectric barrier layer in the second transistor region so as to expose the barrier layer in the second opening; and
   forming a second work function metal layer on the substrate after removing the second portion of the dielectric barrier layer in the second transistor region to fill into the first opening and the second opening.

2. The method as claimed in claim 1, wherein the dielectric barrier layer is a silicon nitride layer.

3. The method as claimed in claim 2, wherein a thickness of the silicon nitride layer is in a range from 20 to 40 angstroms.

4. The method as claimed in claim 2, wherein the silicon nitride layer is formed by an atomic layer deposition process.

5. The method as claimed in claim 2, wherein the step of removing the first work function metal layer in the second transistor region comprises—
   forming a third pattern photoresist layer on the first work function metal layer so that the first transistor region is covered by the third pattern photoresist layer and the second transistor region is exposed from the third pattern photoresist layer;
   removing the first work function metal layer on the silicon nitride layer in the second transistor region; and
   removing the third pattern photoresist layer after the step of removing the second portion of the dielectric barrier layer in the second transistor region.

6. The method as claimed in claim 1, wherein the first portion of the dielectric barrier layer in the first transistor region and the second portion of the dielectric barrier layer in the second transistor region each are removed by a dry etching process.

7. The method as claimed in claim 1, wherein the first work function metal layer in the second transistor region is removed by a wet etching process.

8. The method as claimed in claim 1, wherein the barrier layer is a titanium nitride layer.

9. The method as claimed in claim 1, wherein the first work function metal layer comprises titanium nitride, and the second work function metal layer comprises titanium aluminum.

10. The method as claimed in claim 1, wherein the step of forming the substrate further comprises:
   forming an isolation structure in a silicon substrate so as to define the first transistor region and the second transistor region;
   forming a first dummy gate structure and a second dummy gate structure on the silicon substrate, the first dummy gate structure and the second dummy gate structure locating in the first transistor region and the second transistor region respectively, and the first dummy gate structure and the second dummy gate structure each comprising the high-k dielectric layer, the barrier layer and the dummy gate on the barrier layer;
   forming two spacers surrounding the first dummy gate structure and the second dummy gate structure respectively;
   forming a dielectric layer on the silicon substrate to cover the first dummy gate structure, the second dummy gate structure and the two spacers;
   applying a flattening process to the dielectric layer so as to expose the dummy gate in both the first transistor region and the second transistor region; and
   removing the dummy gate to form the first opening in the first transistor region and the second opening in the second transistor region.

11. The method as claimed in claim 10, wherein the step of removing the first portion of the dielectric barrier layer in the first transistor region further comprises:

forming a first pattern photoresist layer on the dielectric barrier layer so that the second transistor region is covered by the first pattern photoresist layer and the first transistor region is exposed from the first pattern photoresist layer;

removing the dielectric barrier layer on the dielectric layer in the first transistor region and the dielectric barrier layer on the barrier layer and at a bottom of the first opening; and removing the first pattern photoresist layer.

12. The method as claimed in claim 10, wherein before the step of removing the first work function metal layer in the second transistor region, the method further comprises an etch back process to remove the first work function metal layer on the dielectric layer in the first transistor region.

13. The method as claimed in claim 12, wherein the etch back process comprises:

forming a second pattern photoresist layer on the first work function metal layer so that the second transistor region is covered by the second pattern photoresist layer and the first transistor region is exposed from the second pattern photoresist layer;

removing the first work function metal layer on the dielectric layer in the first transistor region; and removing the second pattern photoresist layer.

14. The method as claimed in claim 13, wherein the first work function metal layer on the dielectric barrier layer in the second transistor region is removed by a wet etching process.

15. The method as claimed in claim 1, further comprising forming a contact conductive layer after forming the second work function metal layer.

16. The method as claimed in claim 15, wherein the step of forming the contact conductive layer further comprises:

forming a low resistance conductive material layer to cover the second work function metal layer; and performing a chemical mechanical polishing process to remove the low resistance conductive material layer outside the first opening and the second opening and the second work function metal layer outside the first opening and the second opening.

17. A method for manufacturing a MOS transistor, comprising:

forming a substrate having an opening, a high-k dielectric layer being disposed in the opening and is located at the bottom of the opening and a barrier layer being formed on the high-k dielectric layer;

forming a dielectric barrier layer on the substrate and filled into the opening to cover a sidewall of the opening and the barrier layer located at the bottom of the opening;

removing the dielectric barrier layer on the barrier layer located at the bottom of the opening so as to expose the barrier layer; and forming a work function metal layer on the substrate and filled into the opening, the work function metal layer covering the dielectric barrier layer on the sidewall of the opening and covering the barrier layer located at the bottom of the opening.

18. The method as claimed in claim 17, wherein the dielectric barrier layer is a silicon nitride layer.

19. The method as claimed in claim 18, wherein a thickness of the silicon nitride layer is in a range from 20 to 40 angstroms.

20. The method as claimed in claim 18, wherein the silicon nitride layer is formed by an atomic layer deposition process.

21. The method as claimed in claim 17, wherein the dielectric barrier layer on the barrier layer located at the bottom of the opening is removed by a dry etching process.

22. The method as claimed in claim 17, wherein the barrier layer is a titanium nitride layer.

23. The method as claimed in claim 17, wherein the work function layer comprises a titanium aluminum layer.

24. The method as claimed in claim 17, wherein the work function layer comprises a titanium nitride layer and a titanium aluminum layer on the titanium nitride layer.

25. The method as claimed in claim 17, further comprising forming a contact conductive layer after forming the second work function metal layer.

26. The method as claimed in claim 25, wherein the step of forming the contact conductive layer further comprises:

forming a low resistance conductive material layer to cover the second work function metal layer; and performing a chemical mechanical polishing process to remove the low resistance conductive material layer outside the first opening and the second opening and the second work function metal layer outside the first opening and the second opening.

* * * * *